(12) United States Patent
Khoury (10) Patent No.: US 6,445,606 B1
(45) Date of Patent: Sep. 3, 2002

(54) SECURE POLY FUSE ROM WITH A POWER-ON OR ON-RESET HARDWARE SECURITY FEATURES AND METHOD THEREFOR

(75) Inventor: Elie Georges Khoury, Gilbert, AZ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/852,018

(22) Filed: May 10, 2001

(51) Int. Cl.$^7$ ................................................ G11C 17/00
(52) U.S. Cl. ............................. 365/96; 365/94; 365/104
(58) Field of Search ............................ 365/96, 104, 94

(56) References Cited

U.S. PATENT DOCUMENTS 6,182,187 B1 * 1/2001 Cox et al. ..................... 711/5
6,185,696 B1 * 2/2001 Noll ............................. 714/11
6,279,114 B1 * 8/2001 Toombs et al. ................. 710/8

* cited by examiner

Primary Examiner—Hoai Ho
(74) Attorney, Agent, or Firm—Peter Zawilski (57) ABSTRACT

A secure one-time programmable (OTP) salicided poly fuse array (2×8) cells with a power-on or on-reset hardware security feature is proposed. The secure OTP which is based on a primitive building cell that includes a salicided poly fuse and a MOS switch, utilize the same building block of the un-secure larger OTP array. This includes an enhanced multistage track & latch sense amp, or comparator, primitive memory cells, decoders for write and read mechanism, and a similar control block.

14 Claims, 11 Drawing Sheets

SECURE POLY FUSE ROM WITH A POWER-ON OR ON-RESET HARDWARE SECURITY FEATURES AND METHOD THEREFOR

FIELD OF THE INVENTION

The invention relates generally to one-time programmable ROM memory elements and more specifically to a one time programmable ROM element with secure read access.

BACKGROUND OF THE INVENTION

A large number of integrated circuit applications require some sort of electrically programmable, non-volatile memory for storing information. To accommodate the increased demand for electrically programmable memory in modern integrated circuits, a number of well known memory technologies are available, including for example, programmable read only memories (PROMs), erasable programmable read-only memories (EPROMs), electrically erasable programmable read-only memories (EPROMs), field programmable gate arrays (FPGAs), and fuse devices.

The fuse element, or (one time programmable) OTP fuse element is often formed from a conductive salicided poly silicon wire. In an unblown—unprogrammed—state, the fuse is conducting with a low impedance. To program the fuse a large programming current of approximately 20 mA, is applied to the salicided poly silicon wire, resulting in heating of the salicided poly silicon wire causing a high impedance connection once the salicided poly silicon wire is blown. Of course, once a fuse is blown, the written data is non-erasable.

Data written and stored within each of these devices is easily accessible once an addressing scheme is implemented for accessing the data. For example, on a 1×8 OTP ROM, upon power-up the output ports will contain the value stored within the ROM. As a result, secure data written to any of these memory locations is not secure.

It is therefore an object of this invention to provide a fuse memory device having an array of fuse elements as well as a control circuit for providing secure access to the stored data within, wherein the secure data is inaccessible from within the fuse memory device without proper control circuit operation and secure access verification.

SUMMARY OF THE INVENTION

In accordance with the present invention, there is provided a secure one time programmable (OTP) ROM comprising:
  secure data storage for storing a secure data value;
  an output port; and,
  a data retrieval circuit operable in a first mode and in a second other mode for in the first mode providing a first known value other than the value stored in the secure data storage to the output port and in the second other state for providing the value stored in the secure data storage is provided to the to the output port.

In accordance with another aspect of the present invention, there is provided a method of performing a secure read on a one time programmable (OTP) ROM device having a secure value stored therein comprising the steps of:
  providing a secure output register;
  resetting the device;
  storing within the secure output register a known value other than the secure value; and,
  performing a secure read operation to retrieve the secure value and to latch the retrieved secure value into the secure output register in dependence upon the secure read operation.

BRIEF DESCRIPTION OF THE DRAWINGS

The invention will now be described in conjunction with the attached drawings in which.

DETAILED DESCRIPTION OF THE INVENTION

During reset or power-up, the secure and test output registers are set to a programmed value. When reset is de-asserted (or the chip is powered up) the secure linear pulse generator initiates a secure read cycle and locks out the control for normal read cycle. At the end of the secure read cycle, the secure output register latches in the values of the secure bits of the OTP. A normal read cycle is initiated any time after a secure read cycle is completed.

For test purposes, the normal read cycle reads the secure or the test parts of the OTP and output the result on the test output register.

Figure 1:
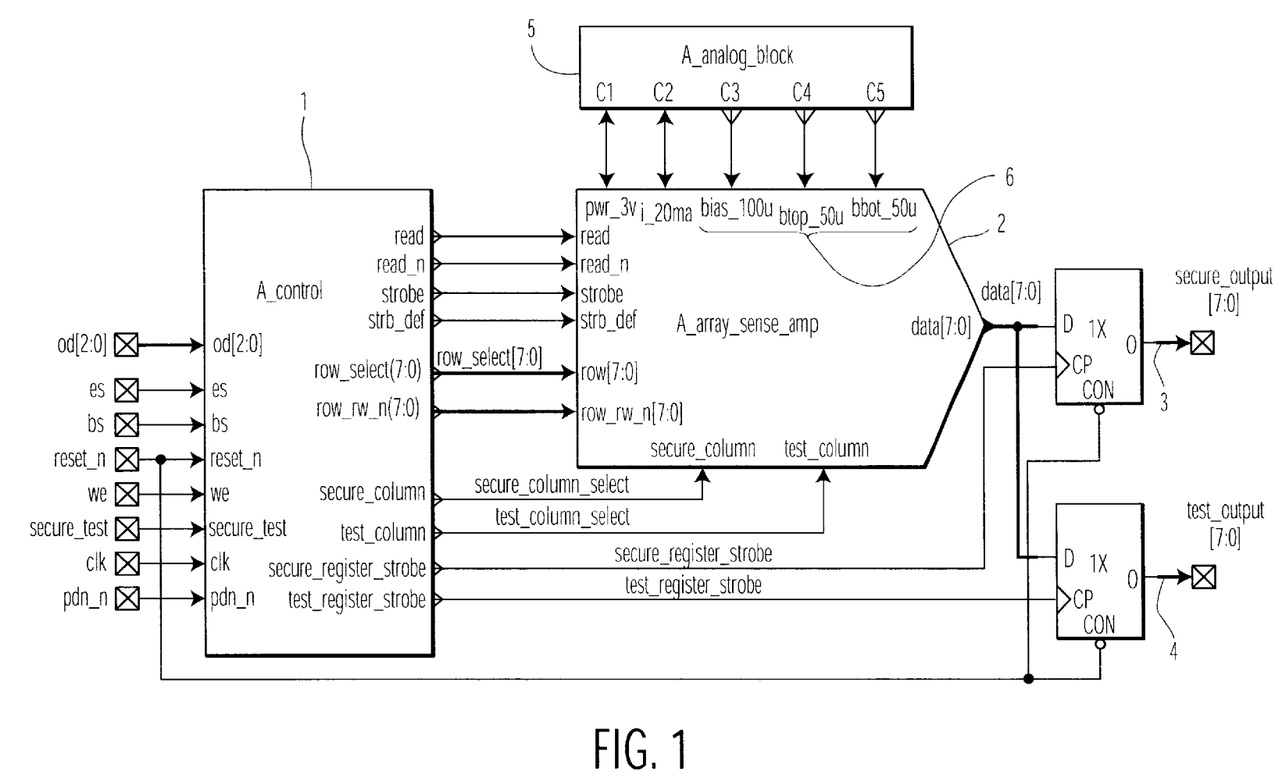
FIG. 1 is a diagram of a secure poly fuse array circuit.

FIG. 1, illustrates a top-level design of the secure one-time programmable (OTP). It comprises a control block 1, a fuse array and sense amplifier array 2, an 8-bit secure output register 3, an 8-bit test output register 4, and an analog block 5. The analog block 5 contains 3 bias generators 6 that set the read and write current for the fuse array and sense amplifier array 2 as part of the secure OTP. The secure output register 3 is used by the secure read operation circuitry after a power-up or reset operation, and the secure test register 4 is used by the normal read operation circuitry to check the test or secure bits.

Figure 2:
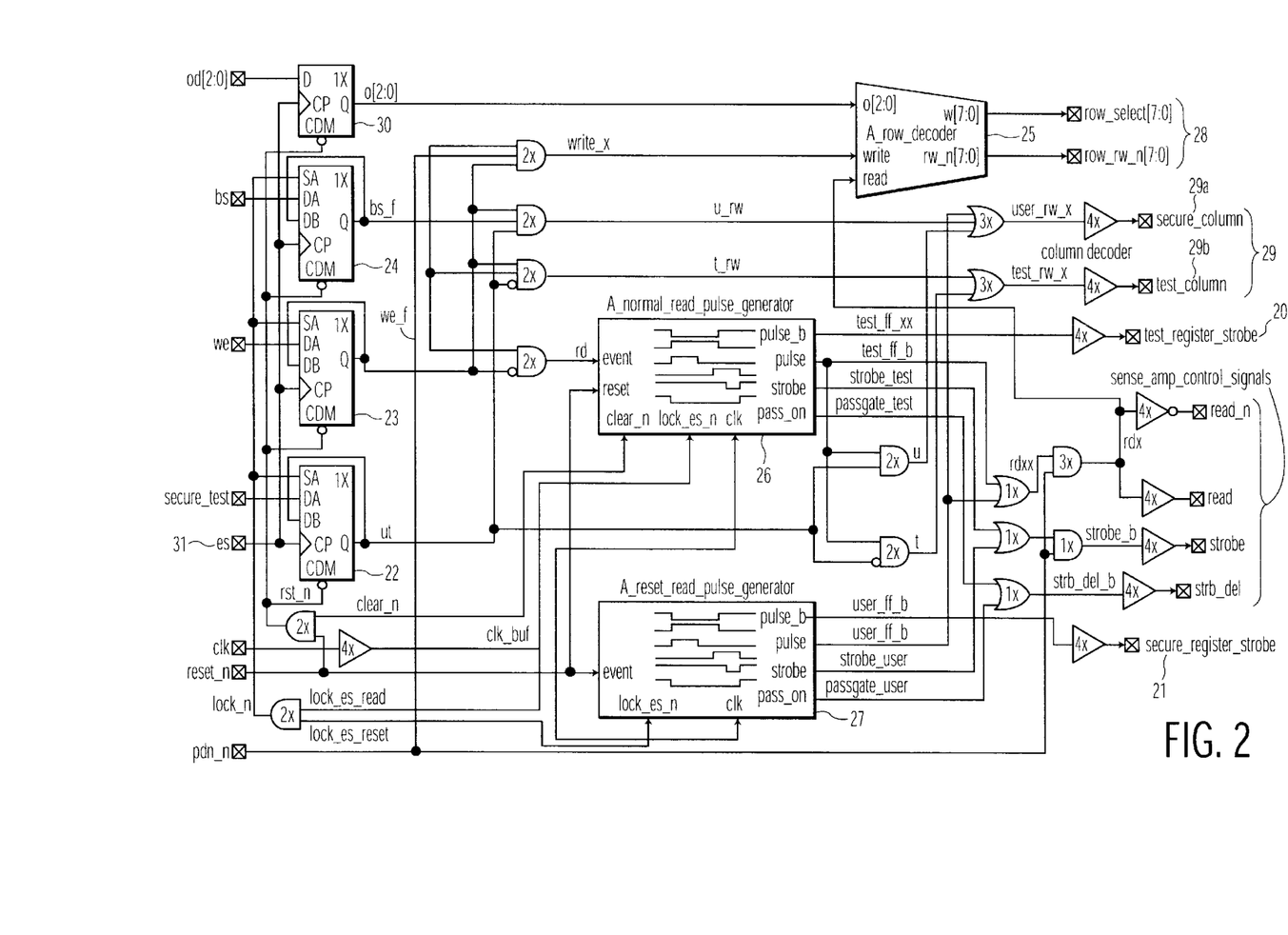
FIG. 2 is a diagram of a control block forming part of the secure poly fuse array circuit.

FIG. 2, illustrates the Control block 1. The control block 1 comprises a row decoder 25, a normal read pulse generator 26, a reset pulse generator 27, three input registers 22 23 24, a test register strobe 20 and a secure register strobe 21 output strobe signals. The three input registers are for latching the secure or test column address signal 22, block select signal 24, and write enable signal 23. The row decoder 25 provides the row address to the fuse array and sense amplifier array 2 via output ports 28, and the column within the fuse array and sense amplifier array 2 is determined from signals at output ports 29. The normal read pulse generator 26 is for controlling the normal read cycle and the reset pulse generator 27 is for controlling the secure read cycle. The result of the secure read is provided in the secure output register, while the result of the normal read operation is provided in the test output register. The column decoder output ports 29 are for selecting either the secure column 29a or test column 29b during read or write operation cycles. Both the normal read pulse generator and the reset read pulse generator are event driven shift registers. Upon a transition from low to high on the enable strobe signal 31 all inputs to the registers 22 23 24 and the address 30 are latched.

The control block if for performing the following three functions: performing a secure read operation after power-up or reset de-assertion, performing a normal read operation at any time after a secure read operation is completed, and writing to any OTP fuse. The secure register strobe 21 writes to the secure output register 3 and the test register strobe 20 writes to the test output register 4.

Figure 3:
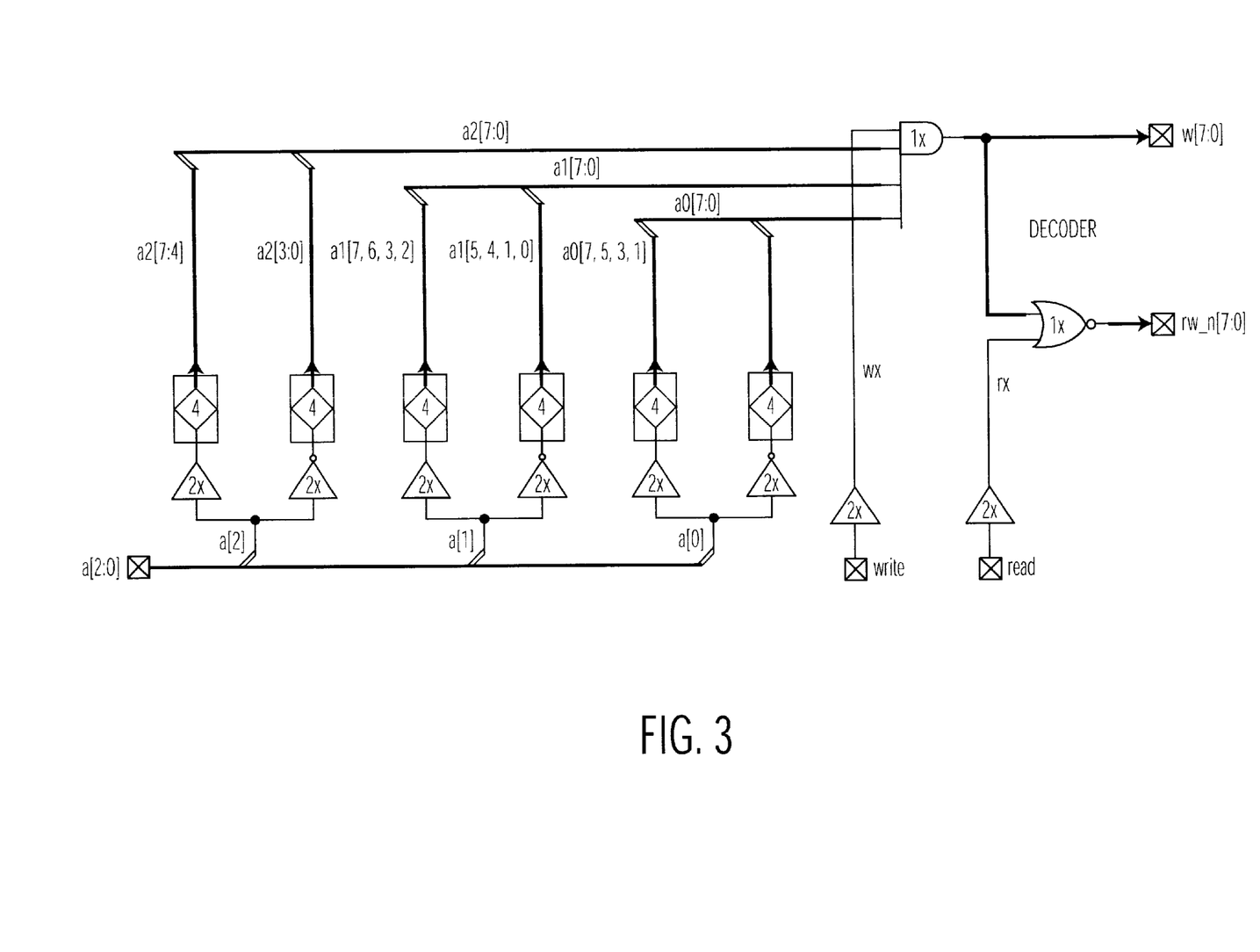
FIG. 3 is a diagram of a row decoder forming part of the secure poly fuse array circuit.

FIG. 3 illustrates the row decoder component 25 of the Control block 1, where the function of the row decoder is for selecting the array's row within the fuse array and sense amplifier array 2 during a write cycle only.

Figure 4:
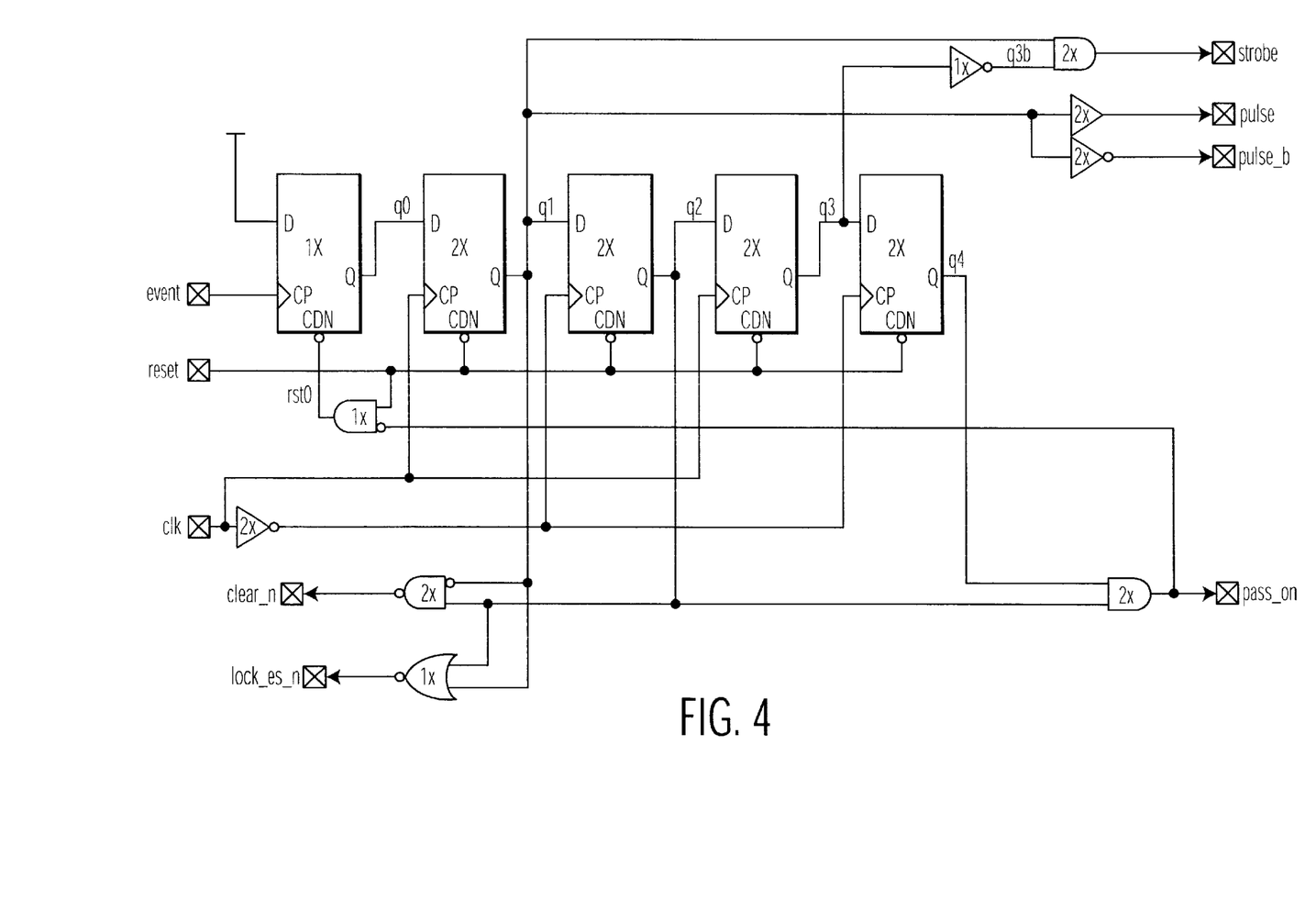
FIG. 4 is a diagram of a normal read pulse generator forming part of the secure poly fuse array circuit.

FIG. 4 illustrates the normal read pulse generator component 26 of the Control block 1. Used in a normal read cycle the read linear pulse generator controls fuse array and sense amplifier array 2 via the test output strobe signal 20. In operation the test output register latches the secure or test data. After a read cycle the normal read pulse generator strobes the output signals of the sense amp into the test register.

Figure 5:
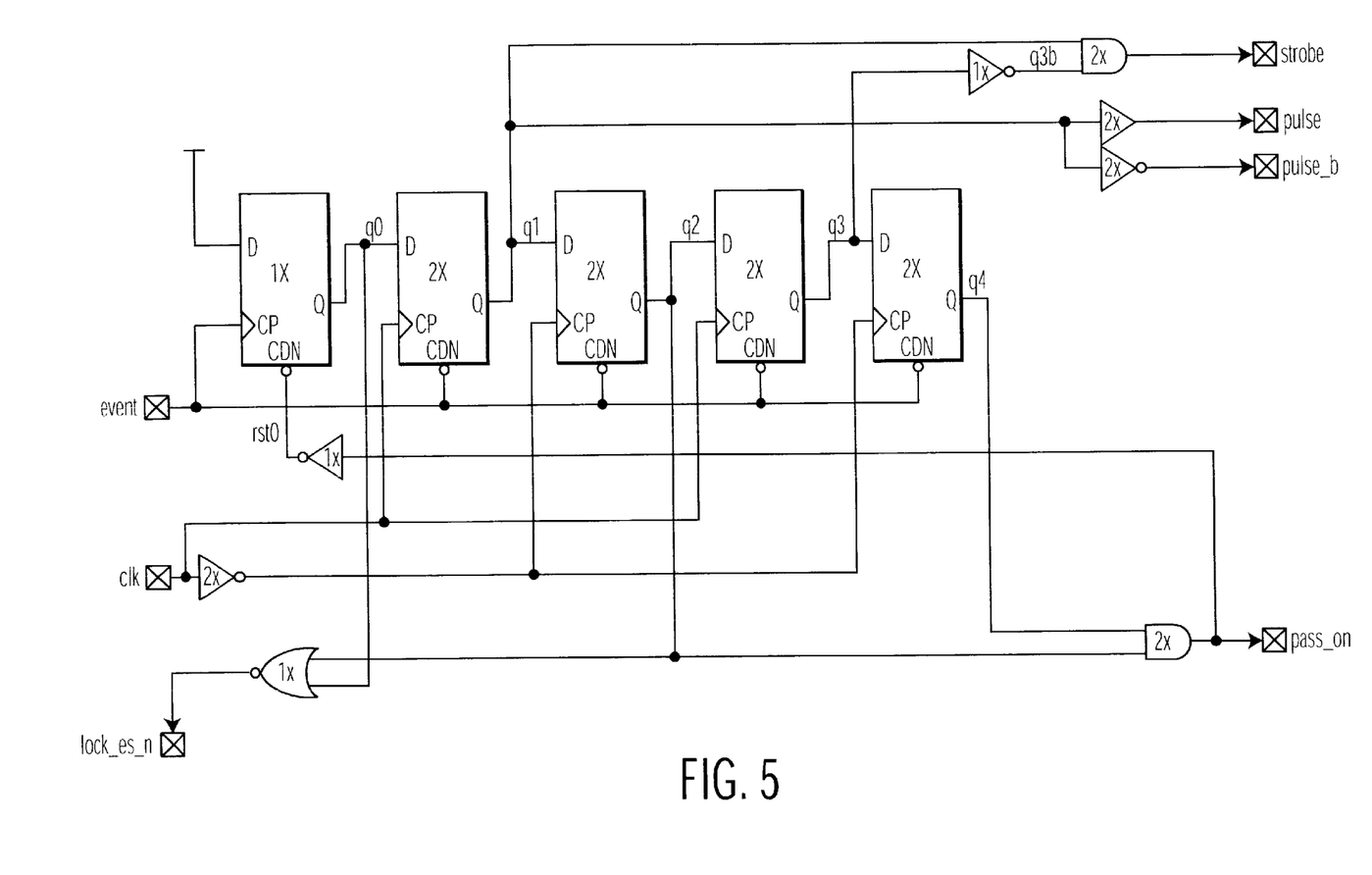
FIG. 5 is a diagram of a reset pulse generator forming part of the secure poly fuse array circuit.

FIG. 5 illustrates the reset read pulse generator component of the Control block. Used in a reset read cycle the reset read pulse generator controls the fuse array and sense amplifier array 2 via the secure output strobe signal 21. In a secure read operation the secure output register latches the secure data. After a read cycle the reset read pulse generator strobes the output signals of the fuse array and sense amplifier array 2 into the secure register.

Figure 6:
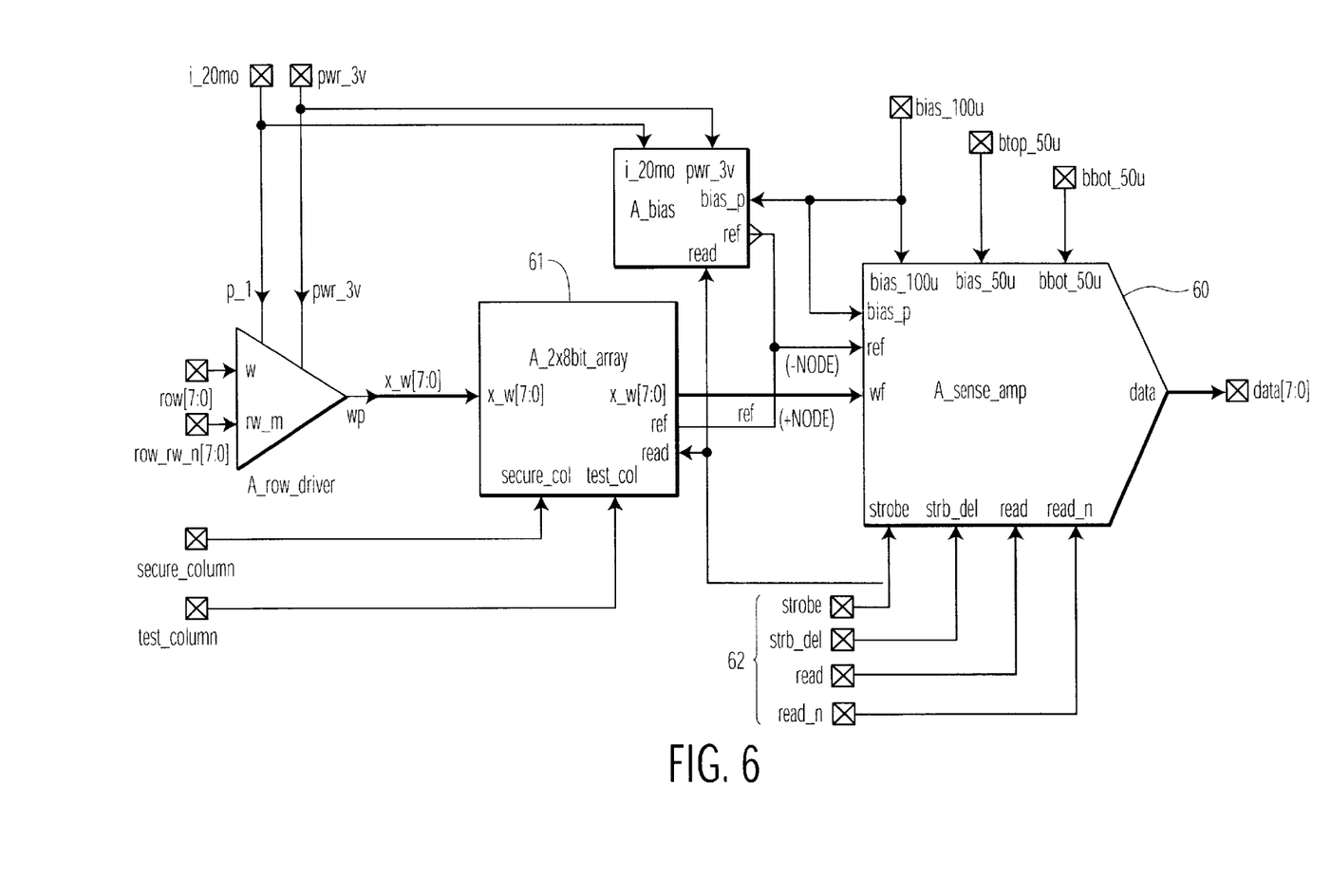
FIG. 6 is a diagram of a 2×8 OTP ROM array and sense amps forming part of the secure poly fuse array circuit.

FIG. 6 illustrates a 2×8 array 61 and sense amplifier 60 as part of the fuse array and sense amplifier array 2. Each sense amp senses the secure or test poly fuse state (blown or unblown) and provides the sensed result to the output register. There is one track & latch sense amp and comparator, provided for each row. For a 2×8 secure array of OTP poly fuse elements there are 8 sense amps.

Figure 7:
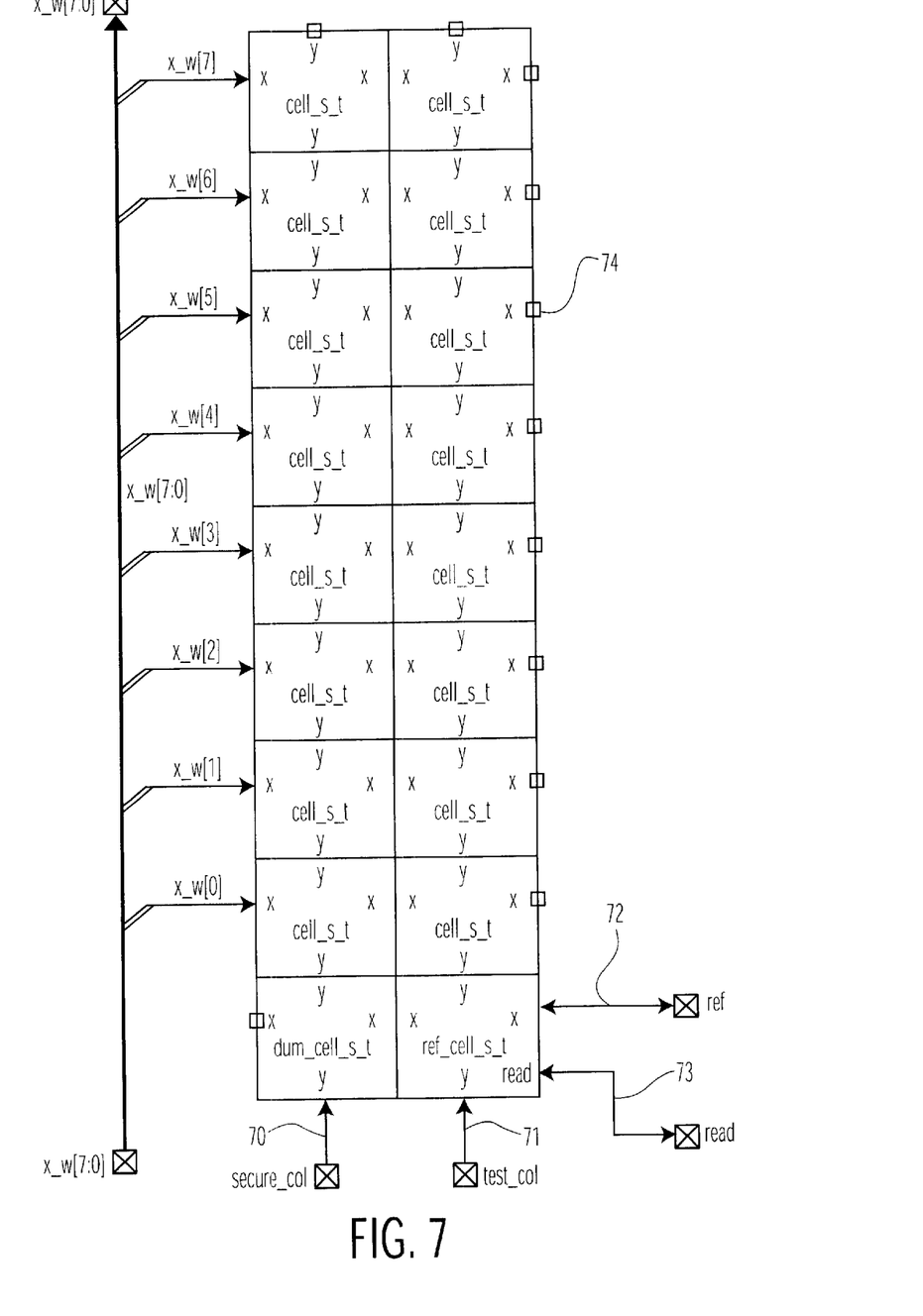
FIG. 7 is a diagram of a 2×8 secure array forming part of the secure poly fuse array circuit.

FIG. 7 illustrates a 2×8 secure array of OTP poly fuse elements 74 forming part of the fuse array and sense amplifier array 2, where one secure column 70 of 8 bits is for storing secure data and the other test column 71 of 8 bits is for storing test data.

Figure 8:
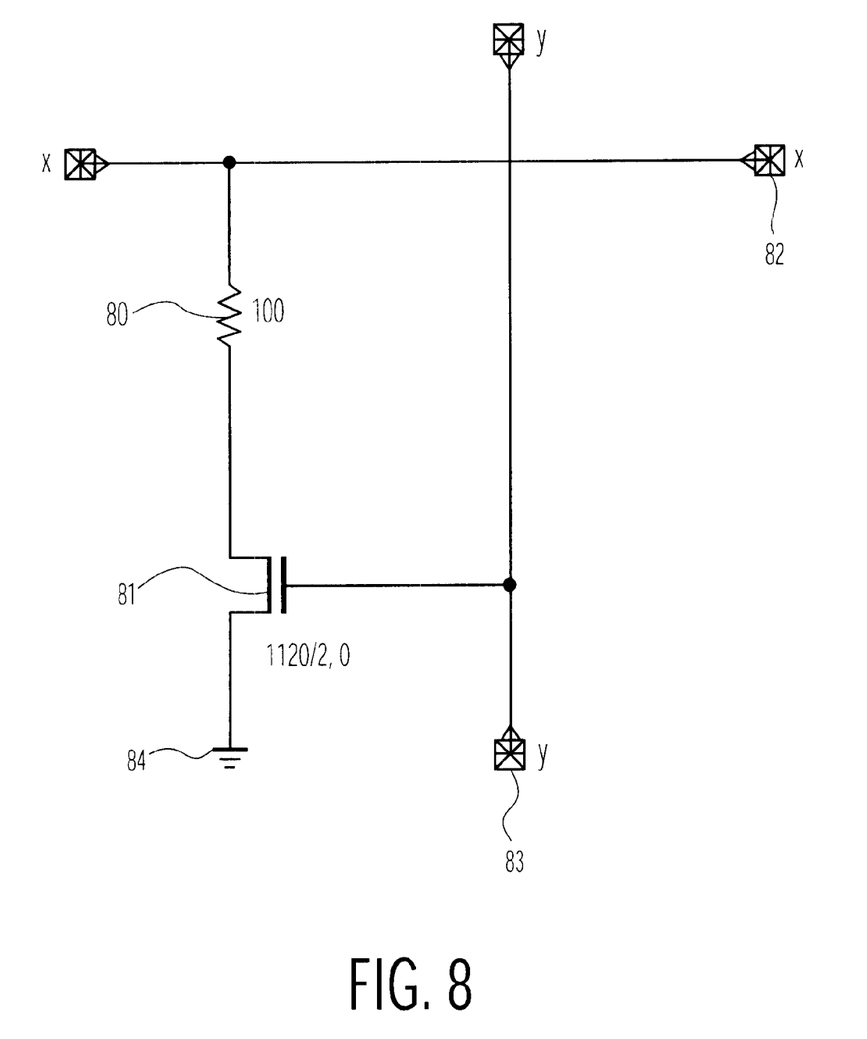
FIG. 8 is a diagram of a single poly fuse element forming part of the secure poly fuse array circuit.

FIG. 8 illustrates a single poly fuse element forming part of the 2×8 secure array of FIG. 7, which comprises of a fuse element 80 and an N-MOS transistor switch 81. The gate of the N-MOS transistor switch 81 is coupled to a column input 83, the source of the N-MOS transistor switch coupled to ground 84, and the drain of the NMOS transistor is coupled through a resistor 80 to a row input 82.

The fuse element, or (one time programmable) OTP fuse element is often formed from a conductive salicided poly silicon wire. In an unblown—unprogrammed—state, the fuse is conducting with a low impedance. To program the fuse a large programming current of approximately 20 mA, is applied to the salicided poly silicon wire, resulting in heating of the salicided poly silicon wire causing a high impedance connection once the salicided poly silicon wire is blown. Of course, once a fuse is blown, the written data is non-erasable.

Of course, other one-time programmable devices are also useful for providing programmability in accordance with the invention.

Reset Mode

Figure 9:
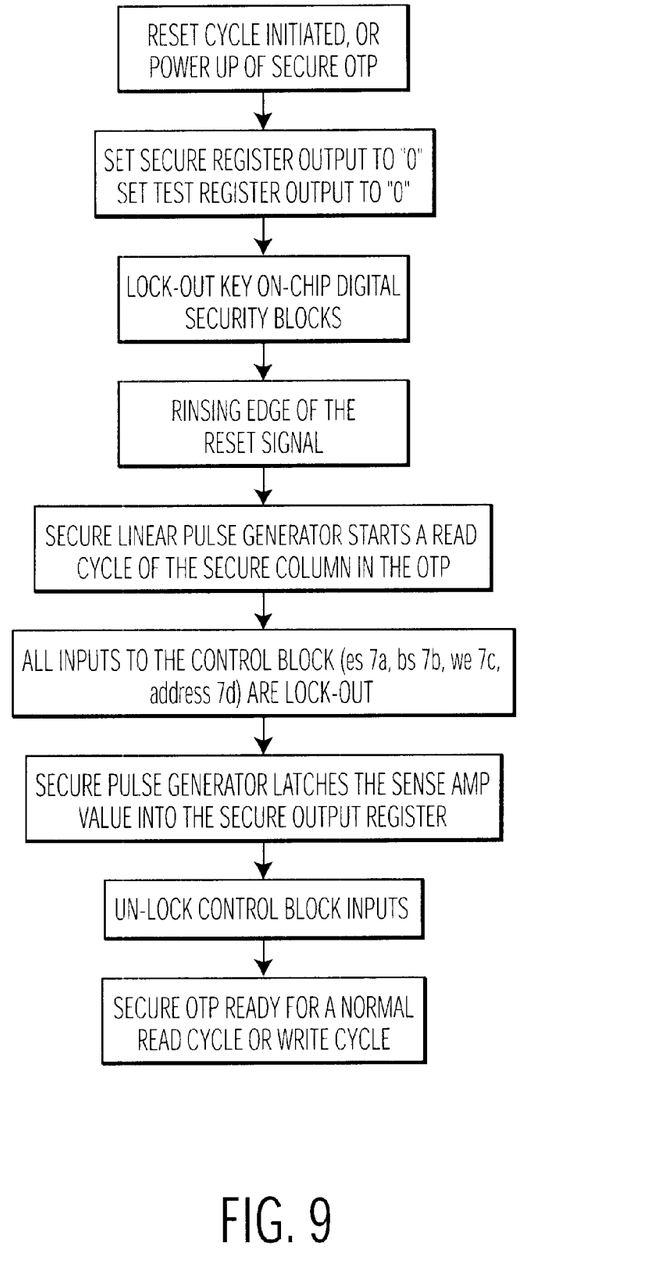
FIG. 9 is a flowchart of a method of performing a reset read cycle on the secure OTP ROM.

FIG. 9 illustrates steps for performing a secure read operation. In the secure mode or programmed mode, during reset or power-up of a circuit such as that shown in FIG. 1, both the test register 4 output ports and the secure register 3 output ports are set to a default value; here the default value is "off" or "low" or "0". Alternatively, a different default value is set. The default mode for the secure OTP is the secure mode—the programmed mode. In the secure mode bits are programmed. Of course, only those bits with other than a default value need be programmed as the bits with the default value are already correctly set. While the OTP output ports including the test register and the secure register, are set to the default value, designers can use this default value to lock-out key on-chip digital security blocks in the secure mode of operation provided by the secure OTP.

After the reset is de-asserted, or the chip is powered up, on the rising edge of the reset signal the secure linear pulse generator starts a secure read cycle of the secure column in the OTP. During this secure read cycle all input ports to the control block, es 7a, bs 7b, we 7c, address 7d, are locked-out to prevent an accidental normal read cycle from commencing. At the end of the secure read operation, the secure pulse generator latches the sense amp value into the secure output register and unlocks the control block input paths for supporting future normal read cycle or write cycle.

Normal Read Cycle

Figure 10:
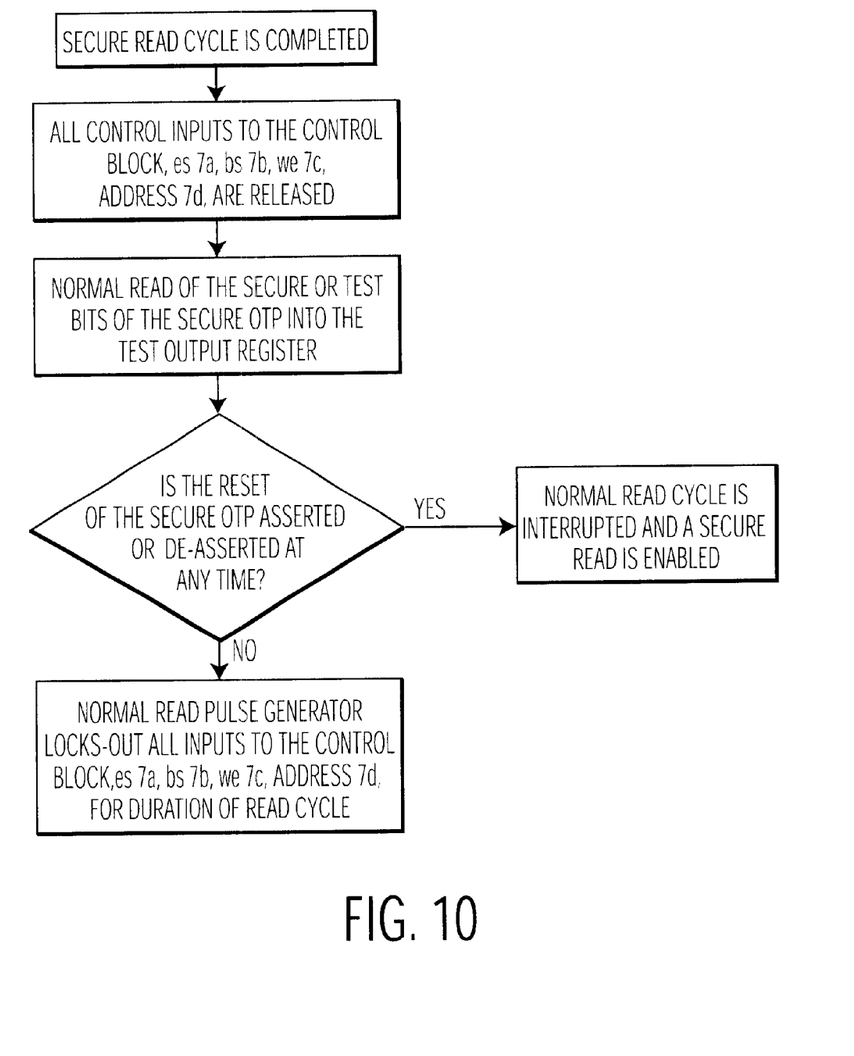
FIG. 10 is a flowchart of a method of performing a normal read cycle on the secure OTP ROM.

FIG. 10 illustrates the steps for performing a normal read cycle from the secure OTP ROM. After a secure read cycle is completed, all input paths to the control block, es 7a, bs 7b, we 7c, address 7d, are released to allow a normal read operation allowing for a read of the secure or test bits of the secure OTP into the test output register. Once a normal read operation is initiated the normal read pulse generator lock-sout all input values to the control block, es 7a, bs 7b, we 7c, address 7d for the duration of the read cycle in order to prevent accidental read operations while all 8 sense amps are resolving the status of the poly fuse bits.

If the reset of the secure OTP is asserted and de-asserted at any time during a normal read cycle, the normal read cycle is interrupted and a secure read operation is enabled. The priority of a reset function overrides any other function of the secure OTP.

Write Cycle—Blowing the Secure or Test Poly Fuse

Figure 11:
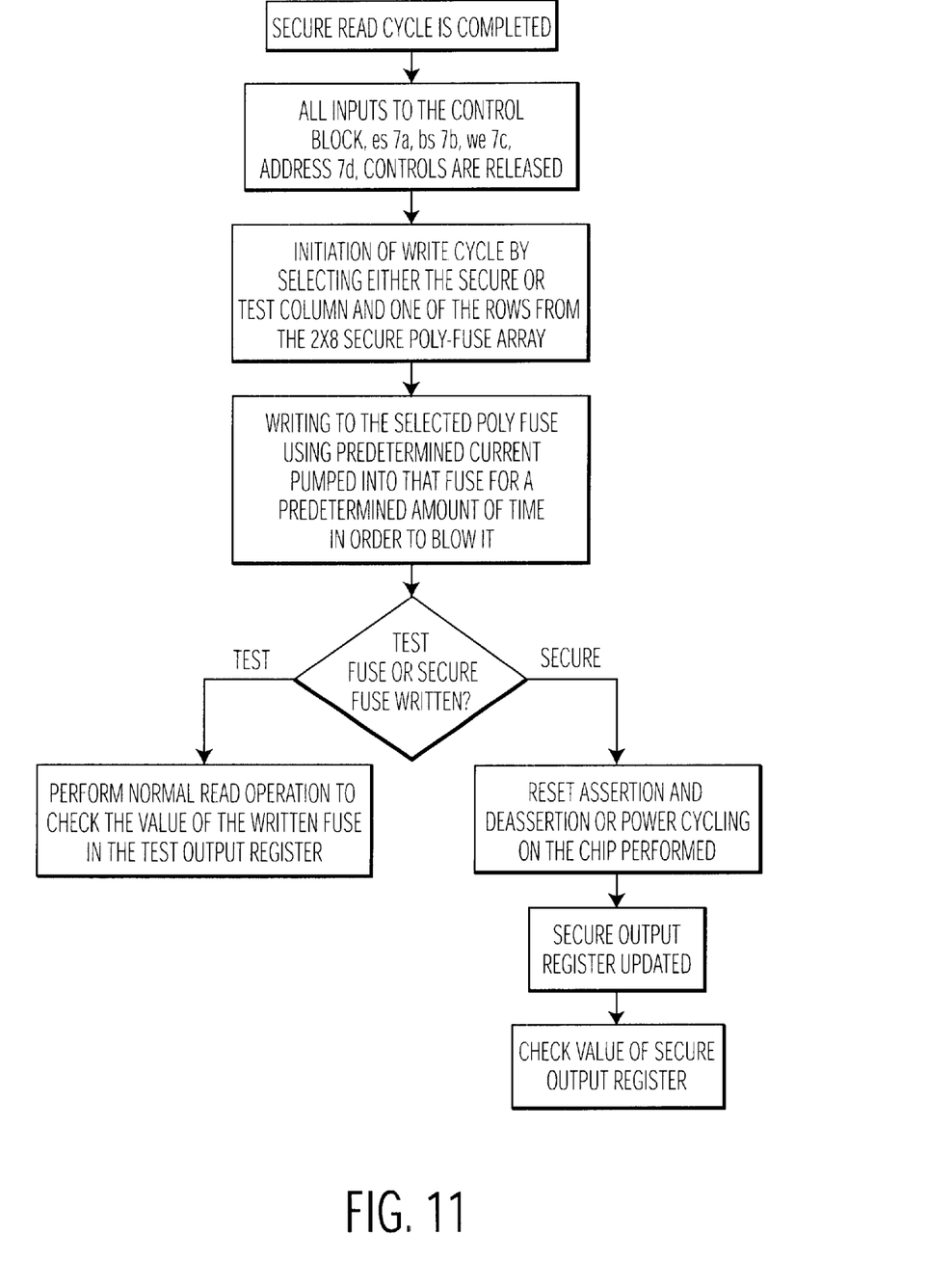
FIG. 11 is a flowchart of a method of performing a write cycle on the secure OTP ROM.

FIG. 11 illustrates the steps for performing a write cycle to the secure OTP ROM. After a secure read cycle is completed, all input paths to the control block, es 7a, bs 7b, we 7c, address 7d, controls are released to allow writing to the secure and test fuses. A write cycle is initiated by selecting either the secure or test column and one of the rows from the 2×8 secure poly-fuse array. To write to the selected poly fuse, a predetermined current is pumped into that fuse 80 for at least a predetermined amount of time in order to "blow" the fuse. The predetermined current for a write operation is based on the analog block 5.

Once a write cycle is completed, the write operation success is tested by performing a normal read operation and checking the value of the test output register. If a secure bit is written to the secure output register, the secure output register is not updated until a reset assertion and de-assertion or power cycling of the chip is performed.

During power-up or reset the secure OTP secure output register is set to a programmed value. A programmed value is used by designers to lock or disable key features of the on-chip design. Advantageously, for security purposes, some key digital functions are immune to the intervention of hackers during the reset or power-up mode. When the secure OTP is powered-up and/or reset is de-asserted, the control block performs only one secure read operation, reading the secure bits of the secure OTP into the secure output register. This allows one time unlocking of some key digital function according to the stored value in the secure OTP.

For example, when the OTP ROM is used to store a start address for processor execution, the default values are set to a pause processor value to hold the processor in limbo pending full power up. Thus, it is impossible to access the processor prior to ROM power-up and loading of the first address for process execution. As such, one timeframe wherein security concerns are substantial is avoided.

Numerous other embodiments may be envisioned without departing from the spirit or scope of the invention.

What is claimed is:

1. A secure one time programmable (OTP) ROM comprising:

secure data storage for storing a secure data value;

an output port; and, a data retrieval circuit operable in a first mode and in a second other mode for in the first mode providing a first known value other than the value stored in the secure data storage to the output port and in the second other state for providing the value stored in the secure data storage is provided to the to the output port.

2. A secure one time programmable (OTP) ROM as defined in claim 1, wherein the data retrieval circuit is placed in the first mode upon power being applied to the device.

3. A secure one time programmable (OTP) ROM as defined in claim 2, wherein the data retrieval circuit is switched from the first mode to the second mode upon a successful data access of data within the secure data storage.

4. A secure one time programmable (OTP) ROM as defined in claim 3,,comprising:

an array sense amplifier having an array of secure poly fuse elements, the poly fuse elements for use in storing data within the secure data storage.

5. A secure one time programmable (OTP) ROM as defined in claim 4, wherein said array sense amplifier further comprising an array of test poly fuse elements for use in storing of data within other than the secure data storage.

6. A secure one time programmable (OTP) ROM as defined in claim 5, wherein each array comprises a 1×8 array of poly fuse elements.

7. A secure one time programmable (OTP) ROM as defined in claim 4, wherein the data retrieval circuit comprises:

a control block for enabling the second other mode of operation to provide access to the secure data storage.

8. A secure one time programmable (OTP) ROM as defined in claim 1, comprising:

a programming circuit including analogue circuitry for adjusting two bias read voltages and write current provided to array sense amplifiers for enabling reading and storage of data within the secure data storage.

9. A secure one time programmable (OTP) ROM as defined in claim 3, comprising: a secure output register for maintaining the known value in the first mode of operation and the value stored in the secure data storage in the second other mode of operation, wherein data retrieved from the secure one time programmable (OTP) ROM is the data stored in the secure output register.

10. A method of performing a secure read on a one time programmable (OTP) ROM device having a secure value stored therein comprising the steps of:

providing a secure output register;

resetting the device;

storing within the secure output register a known value other than the secure value; and, performing a secure read operation to retrieve the secure value and to latch the retrieved secure value into the secure output register in dependence upon the secure read operation.

11. A method of performing a secure read on a one time programmable (OTP) ROM device having a secure value stored therein according to claim 10, wherein the secure read operation includes the step of generating a linear pulse having known characteristics for initiating the secure read operation.

12. A method of performing a secure read on a one time programmable (OTP) ROM device having a secure value stored therein according to claim 11, wherein the step of performing a secure read is preceded by the step of: locking out all inputs to the control block, and wherein the step of performing a secure read is followed by the step of: unlocking all inputs to the control block.

13. A method of performing a secure read on a one time programmable (OTP) ROM device according to claim 12 comprising the step of:

generating the secure linear pulse upon completion of an expected power-up sequence of events of the circuit and absent receipt of an external command for retrieving the secure data from the storage.

14. A method of performing a secure read on a one time programmable (OTP) ROM device according to claim 11 comprising the step of:

generating the secure linear pulse upon completion of an expected power-up sequence of events of the circuit and absent receipt of an external command for retrieving the secure data from the storage.

* * * * *